US010686534B2

(12) United States Patent
Han et al.

(10) Patent No.: US 10,686,534 B2
(45) Date of Patent: Jun. 16, 2020

(54) METHOD FOR OPTICAL INTERCONNECTION BETWEEN SEMICONDUCTOR CHIPS USING MID-INFRARED

(71) Applicant: KOREA INSTITUTE OF SCIENCE AND TECHNOLOGY, Seoul (KR)

(72) Inventors: Jaehoon Han, Seoul (KR); Sanghyeon Kim, Seoul (KR); Hyunsu Ju, Seoul (KR); Jin-Dong Song, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 16/376,672

(22) Filed: Apr. 5, 2019

(65) Prior Publication Data

US 2019/0312654 A1    Oct. 10, 2019

(30) Foreign Application Priority Data

Apr. 5, 2018   (KR) .................. 10-2018-0039807

(51) Int. Cl.
*H04B 10/80* (2013.01)
*H04B 10/50* (2013.01)
*H04B 10/66* (2013.01)

(52) U.S. Cl.
CPC ......... *H04B 10/801* (2013.01); *H04B 10/503* (2013.01); *H04B 10/66* (2013.01); *H01L 2225/06534* (2013.01)

(58) Field of Classification Search
None
See application file for complete search history.

(56) References Cited

U.S. PATENT DOCUMENTS 4,533,833 A * 8/1985 Copeland ............. H04B 10/803
250/551
4,966,430 A * 10/1990 Weidel ................. G02B 6/2817
257/84

(Continued)

FOREIGN PATENT DOCUMENTS

| KR | 100364635 B1 | 12/2002 |
| KR | 1020150078874 A | 7/2015 |
| KR | 1020150105309 | 9/2015 |

*Primary Examiner* — Michael Stahl
(74) *Attorney, Agent, or Firm* — Cantor Colburn LLP

(57) ABSTRACT

A method for optical interconnection between semiconductor chips according to an embodiment include converting an electrical signal to an optical signal, transmitting the optical signal to a second substrate disposed above or below a first substrate using an optical transmitter provided on the first substrate, receiving the optical signal using an optical detector provided on the second substrate, and converting the received optical signal to an electrical signal. Accordingly, using a mid-infrared wavelength range of light that is transparent to semiconductor materials such as silicon and next-generation high-mobility materials, it is possible to enable interconnection between stacked semiconductor chips without using metal wiring. Using optical interconnection, it is possible to significantly reduce the bandwidth and power consumption, and overcome the limitations of TSV technology, and it is possible to extend the photonics technology and platform established in the existing Si Photonics, thereby reducing the cost required for design.

9 Claims, 6 Drawing Sheets

(56) References Cited

U.S. PATENT DOCUMENTS

| | | | | |
|---|---|---|---|---|
| 5,198,684 A * | 3/1993 | Sudo | G02B 6/43 | 250/227.11 |
| 5,200,631 A * | 4/1993 | Austin | G02B 6/43 | 257/433 |
| 5,244,818 A * | 9/1993 | Jokerst | H01L 21/78 | 117/915 |
| 5,266,794 A * | 11/1993 | Olbright | G02B 6/43 | 250/214 LS |
| 5,357,122 A * | 10/1994 | Okubora | G02B 6/43 | 257/432 |
| 5,485,021 A * | 1/1996 | Abe | G02B 6/43 | 257/432 |
| 5,546,209 A * | 8/1996 | Willner | G02B 6/43 | 250/551 |
| 5,848,214 A * | 12/1998 | Haas | G02B 6/43 | 385/120 |
| 6,122,187 A | 9/2000 | Ahn et al. | | |
| 6,448,661 B1 | 9/2002 | Kim et al. | | |
| 6,661,943 B2 * | 12/2003 | Li | G02B 6/43 | 359/15 |
| 6,771,846 B2 * | 8/2004 | Byers | G02B 6/43 | 385/14 |
| 6,858,872 B2 * | 2/2005 | Kondo | H01L 21/6835 | 257/432 |
| 7,212,422 B2 | 5/2007 | Koide | | |
| 9,754,921 B2 | 9/2017 | Park et al. | | |
| 2009/0114927 A1 * | 5/2009 | Cho | G02B 6/43 | 257/84 |
| 2014/0131549 A1 * | 5/2014 | Kaskoun | H04B 10/803 | 250/206 |
| 2014/0268980 A1 * | 9/2014 | Kim | G11C 5/063 | 365/64 |
| 2015/0155423 A1 | 6/2015 | Matsuoka et al. | | |
| 2015/0222364 A1 | 8/2015 | Hwang et al. | | |
| 2015/0331206 A1 * | 11/2015 | Dutta | G02B 6/12002 | 385/14 |
| 2015/0372159 A1 * | 12/2015 | Englund | H01L 31/09 | 356/328 |
| 2016/0006518 A1 * | 1/2016 | Kajiyama | H04B 10/803 | 398/164 |
| 2016/0091676 A1 * | 3/2016 | Favreau | G02B 6/122 | 385/14 |

* cited by examiner

METHOD FOR OPTICAL INTERCONNECTION BETWEEN SEMICONDUCTOR CHIPS USING MID-INFRARED

CROSS-REFERENCE TO RELATED APPLICATION

This application claims priority to Korean Patent Application No. 10-2018-0039807, filed on Apr. 5, 2018, and all the benefits accruing therefrom under 35 U.S.C. § 119, the contents of which in its entirety are herein incorporated by reference.

BACKGROUND

1. Field

The present disclosure relates to a method for optical interconnection between semiconductor chips using mid-infrared, and more particularly, to a technology of optical interconnection between semiconductor chips by transmission and reception of a mid-infrared wavelength range of light passing through silicon in a multilayer silicon substrate structure.

2. Description of the Related Art

A silicon (Si) substrate is widely used to fabricate a semiconductor device or an integrated circuit. Recently, with the development of semiconductor process and integration technology, it is possible to implement a multifunctional chip on a die in 1 cm×1 cm size, but integration of circuits into a smaller size is inefficient due to a very high process cost.

Accordingly, to overcome the limitation of the existing integration technology, studies have been made on 3-dimensional (3D) stack technology in many aspects to stack many semiconductor chips with a view of realizing more complex and delicate functions, but the technical limitation of interconnection between semiconductor chips makes it difficult to stack a predetermined number of layers or more.

Wire bonding technology shown in FIG. 1 involves stacking each independent semiconductor chip bonded using a metal wire, and as the number of semiconductor chips stacked is larger, wiring is more complex, and there are technical problems caused by wiring, such as interference and heat generation.

Through Silicon Via (TSV) technology introduced to solve the problems of the wire bonding process involves stacking slave chips on a master chip in a sequential order, creating holes at preset locations of each silicon substrate, and filling the holes with metal as shown in FIG. 2, to make metal wiring easier and reduce interference.

However, the existing TSV technology is difficult to stack a predetermined number of layers or more due to the high cost and low yield problems, and because interconnection is impossible when each semiconductor chip is not correctly aligned, it is more sensitive to a manufacturing error than the wire bonding process. Further, similar to the wire bonding process, as the number of stacks increases, the interconnection bandwidth increases, failing to cope with.

To overcome the limitations of stack technology using metal wiring such as wire bonding or TSV, studies are made on Si photonics technology that enables information transmission and reception between semiconductor chips using photons. However, a wavelength range (for example, 1.3 µm, 1.55 µm) of light generally used for interconnection is blocked/absorbed by next-generation semiconductor materials having high mobility such as SiGe, Ge and InGaAs, and a wavelength range of light generally used for interconnection fails to enable optical interconnection in semiconductor, requiring a separate structure for complex optical wiring.

SUMMARY

The present disclosure is directed to providing technologies for optical interconnection that enables direct information transmission and reception between stacked semiconductor chips without using a physical connection process such as metal wiring or optical wiring. Specifically, the present disclosure is directed to providing optical interconnection between semiconductor chips using a mid-infrared wavelength range of light that is transparent to semiconductor materials such as silicon and next-generation high-mobility materials.

A method for optical interconnection between semiconductor chips according to an embodiment includes converting an electrical signal to an optical signal, transmitting the optical signal to a second substrate disposed above or below a first substrate using an optical transmitter provided on the first substrate, receiving the optical signal using an optical detector provided on the second substrate, and converting the received optical signal to an electrical signal.

In an embodiment, the first substrate and the second substrate may be made of at least one material of silicon (Si), germanium (Ge), silicon germanium (SiGe) and III-V compound.

In an embodiment, the optical signal may be a mid-infrared wavelength range of light, and a wavelength range having transmittance more than a threshold for the first substrate and the second substrate may be selected.

In an embodiment, the optical signal may have a wavelength range between 1.7 µm and 6 µm passing through at least one material of silicon (Si), germanium (Ge), silicon germanium (Site) and III-V compound.

In an embodiment, at least one substrate that is transparent to the optical signal may be further stacked between the first substrate and the second substrate.

In an embodiment, the optical transmitter and the optical detector may include a laser and a photo-sensor capable of transmitting and receiving mid-infrared of a wavelength range between 1.7 µm and 6 µm.

In an embodiment, the laser and the photo-sensor may include III-V compound consisting of at least one material of gallium antimonide (GaSb), indium phosphide (InP), gallium arsenide (GaAs), indium arsenide (InAs) or a combination thereof.

In an embodiment, the laser and the photo-sensor may include at least one material of indium nitride (InN), HgCdTe, lead sulfide/lead selenide (PbS/PbSe), two-dimensional carbon material and two-dimensional boron nitride.

In an embodiment, the first substrate may have a grating structure with textures to transmit an optical signal transmitted from the optical transmitter upwards or downwards.

In an embodiment, the optical transmitter may include a gold mirror having a gradient for transmitting an optical signal upwards, or a gold mirror having a gradient for transmitting a signal in a vertical direction.

In an embodiment, the optical transmitter may include a vertical-cavity surface-emitting laser (VCSEL) to transmit an optical signal upwards or downwards.

In an embodiment, the optical transmitter and the optical detector may be integrated onto the first substrate and the second substrate by an epitaxial lift-off process.

A semiconductor package for optical interconnection between semiconductor chips according to an embodiment comprises: a first substrate and a second substrate stacked in the semiconductor package and made of at least one material of silicon (Si), germanium (Ge), silicon germanium (SiGe) and III-V compound; a first converter provided on the first substrate for converting an electrical signal to an optical signal; an optical transmitter for transmitting the optical signal to the second substrate disposed above or below the first substrate; an optical detector provided on the second substrate for receiving the optical signal; and a second converter provided on the second substrate for converting the optical signal to the electrical signal, wherein the optical signal has a wavelength range between 1.7 µm and 6 µm passing through at least one material of silicon (Si), germanium (Ge), silicon germanium (SiGe) and III-V compound.

With methods for optical interconnection between semiconductor chips according to the embodiments of the present disclosure, it is possible to enable interconnection between stacked semiconductor chips without using metal wiring, by using a mid-infrared wavelength range of light that is transparent to semiconductor materials such as silicon.

According to an embodiment, using optical interconnection, there is provided new technology that may significantly reduce the bandwidth and power consumption and overcome the limitations of Through Silicon Via (TSV) technology (for example, a limited number of stacks, high cost and low yield).

Additionally, as opposed to TSV technology, there is no need for substrate perforation and alignment processes, thereby reducing the process difficulty and cost. Besides, it is possible to extend the photonics technology and platform established in the existing Si Photonics, thereby reducing the cost required for design.

DETAILED DESCRIPTION

The following detailed description of the present disclosure is made with reference to the accompanying drawings, in which particular embodiments for practicing the present disclosure are shown for illustration purposes. These embodiments are described in sufficiently detail for those skilled in the art to practice the present disclosure. It should be understood that various embodiments of the present disclosure are different but do not need to be mutually exclusive. For example, particular shapes, structures and features described herein in connection with one embodiment can be embodied in other embodiment without departing from the spirit and scope of the present disclosure. It should be further understood that changes can be made to locations or arrangements of individual elements in each disclosed embodiment without departing from the spirit and scope of the present disclosure. Accordingly, the following detailed description is not intended to be taken in limiting senses, and the scope of the present disclosure, if appropriately described, is only defined by the appended claims along with the full scope of equivalents to which such claims are entitled.

Hereinafter, the embodiments of the present disclosure will be described in detail with reference to the accompanying drawings.

Figure 1:
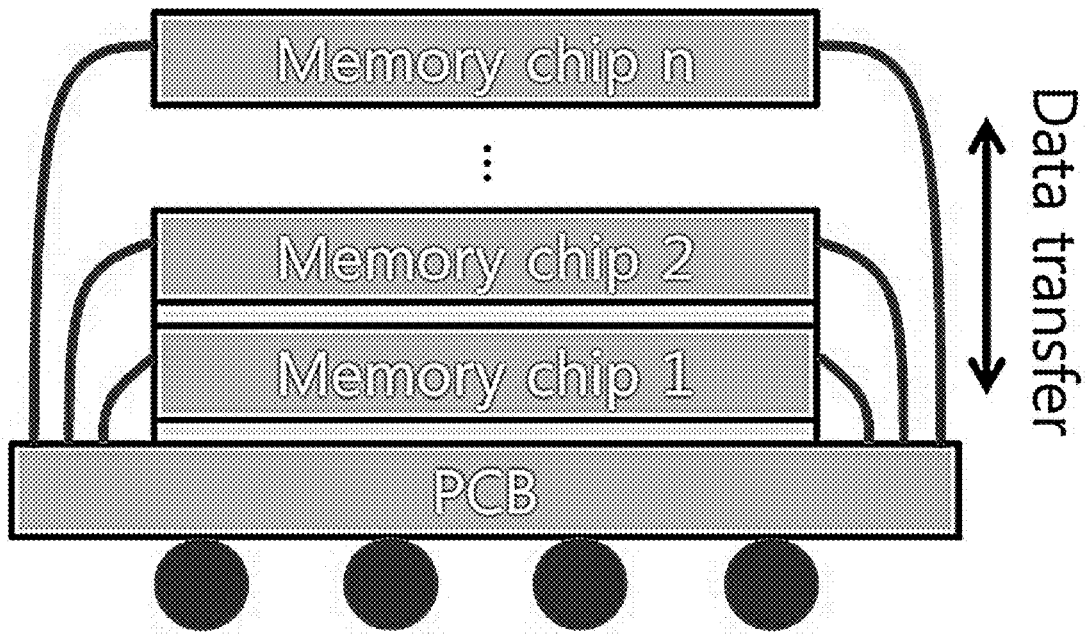
FIG. 1 is a diagram showing a semiconductor chip stack structure according to a wire bonding process.
Figure 2:
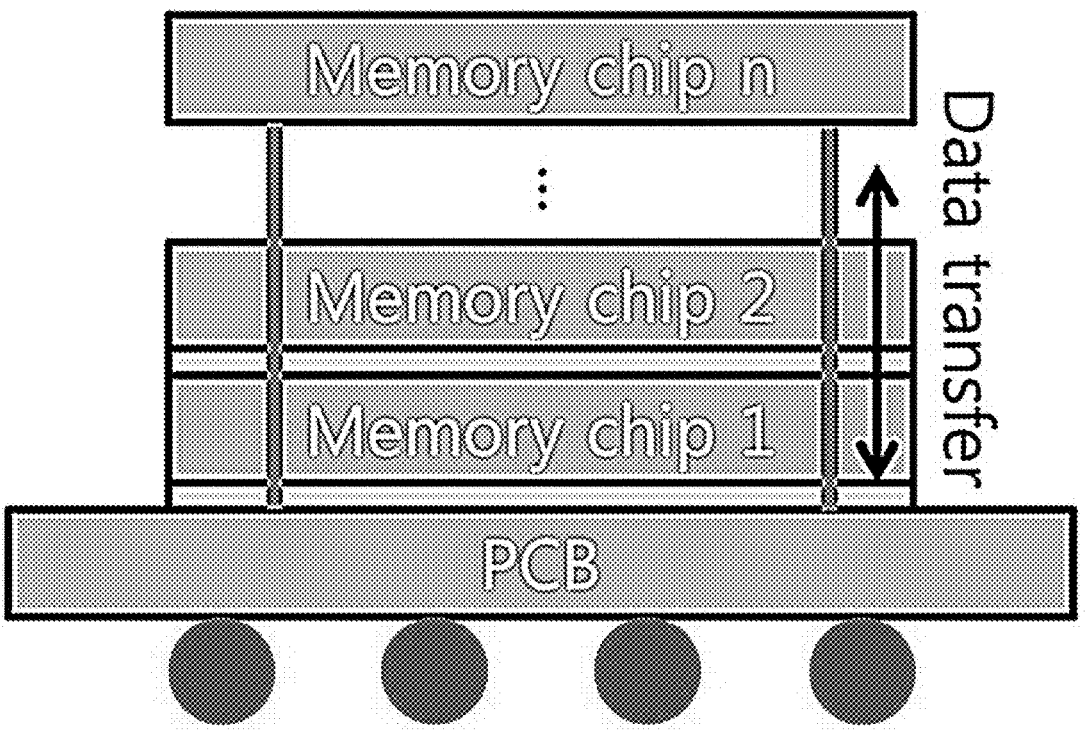
FIG. 2 is a diagram showing a semiconductor chip stack structure according to a Through Silicon Via (TSV) process.

FIGS. 1 and 2 show semiconductor chip stack structures using the wire bonding process and the Through Silicon Via (TSV) process respectively.

As described above, according to the wire bonding process, as the number of semiconductor chips stacked is larger, wiring is more complex, and there are technical problems caused by wiring, such as interference and heat generation, and the TSV process is difficult to stack a predetermined number of layers or more due to the high cost and low yield problems, and is sensitive to a manufacturing error due to the required correct alignment of each layer.

Figure 3:
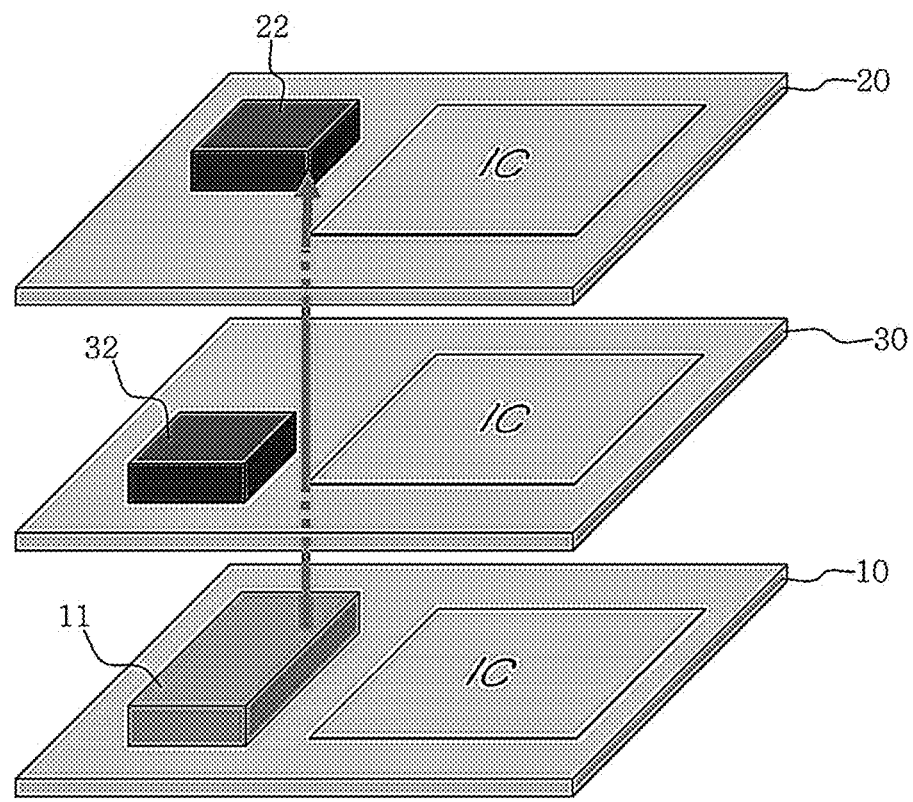
FIG. 3 is a diagram showing a semiconductor chip stack structure using optical interconnection according to an embodiment.

FIG. 3 shows an embodiment of optical interconnection between semiconductor chips for solving the above-described problems.

Referring to FIG. 3, when an optical signal is transmitted toward a second substrate 20 using an optical transmitter 11 provided on a first substrate 10, the optical signal passes through a third substrate 30 stacked on the first substrate 10, and an optical detector 22 provided on the second substrate 20 receives the optical signal, thereby enabling optical interconnection between semiconductor chips.

In an embodiment, the first substrate 10, the second substrate 20 and the third substrate 30 interposed between may be made of silicon (Si), germanium (Ge), silicon germanium (Site) and III-V compound.

In this embodiment, the wavelength range used for optical interconnection may be differently set depending on the material of the substrate, and the wavelength range having transmittance more than the threshold (for example, transmittance of 90% or above is required for optical interconnection between substrates, and as the number of stacks increases, the required threshold increases) is used for each substrate.

Figure 4:
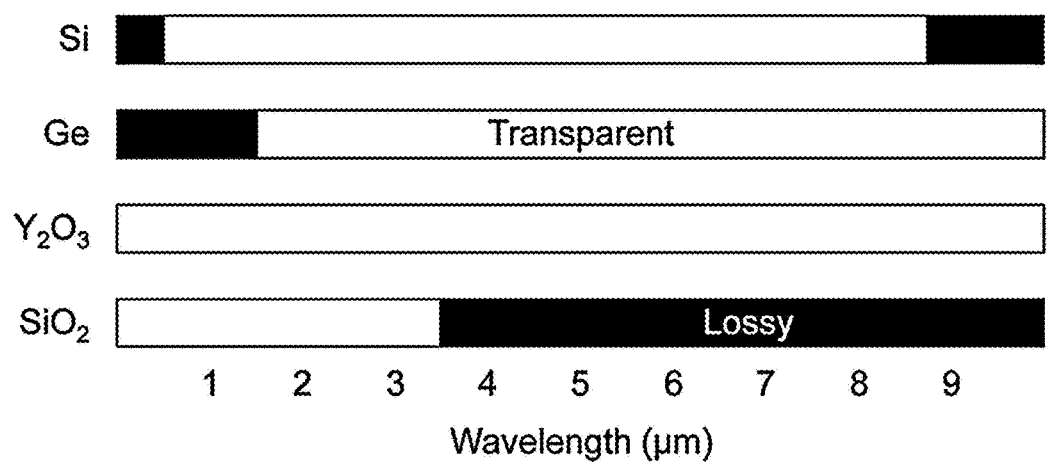
FIG. 4 is a diagram showing transparency of semiconductor constituent materials in wavelength ranges.

FIG. 4 shows transparency of Si, Ge, $Y_2O_3$ and $SiO_2$ in wavelength ranges. As shown, silicon (Si) is transparent in the wavelength range of about 1-8 µm, and germanium (Ge) is transparent in the wavelength range of about 1.7 µm or above, and it is possible to enable interconnection between semiconductor chips using an optical signal of a mid-infrared wavelength range between about 1.7 µm and 6 µm.

The optical interconnection between semiconductor chips as provided herein is characterized in using transparency of semiconductor to a specific wavelength range of light. For example, when the optical transmitter 11 on the first substrate 10 made of silicon transmits an optical signal of a mid-infrared wavelength range between about 1.7 µm and 6 µm upwards, the optical signal reaches the optical detector 22 through the third substrate 30 and the second substrate 20, thereby implementing optical interconnection.

Although it has been hereinabove described that the optical transmitter 11 and the optical detector 22 are respectively provided on the first substrate 10 and the second substrate 20, this is an exemplary structure for helping the understanding of this technology, and the optical transmitter and the optical detector may be placed at any location and differently designed as necessary.

Figure 5:
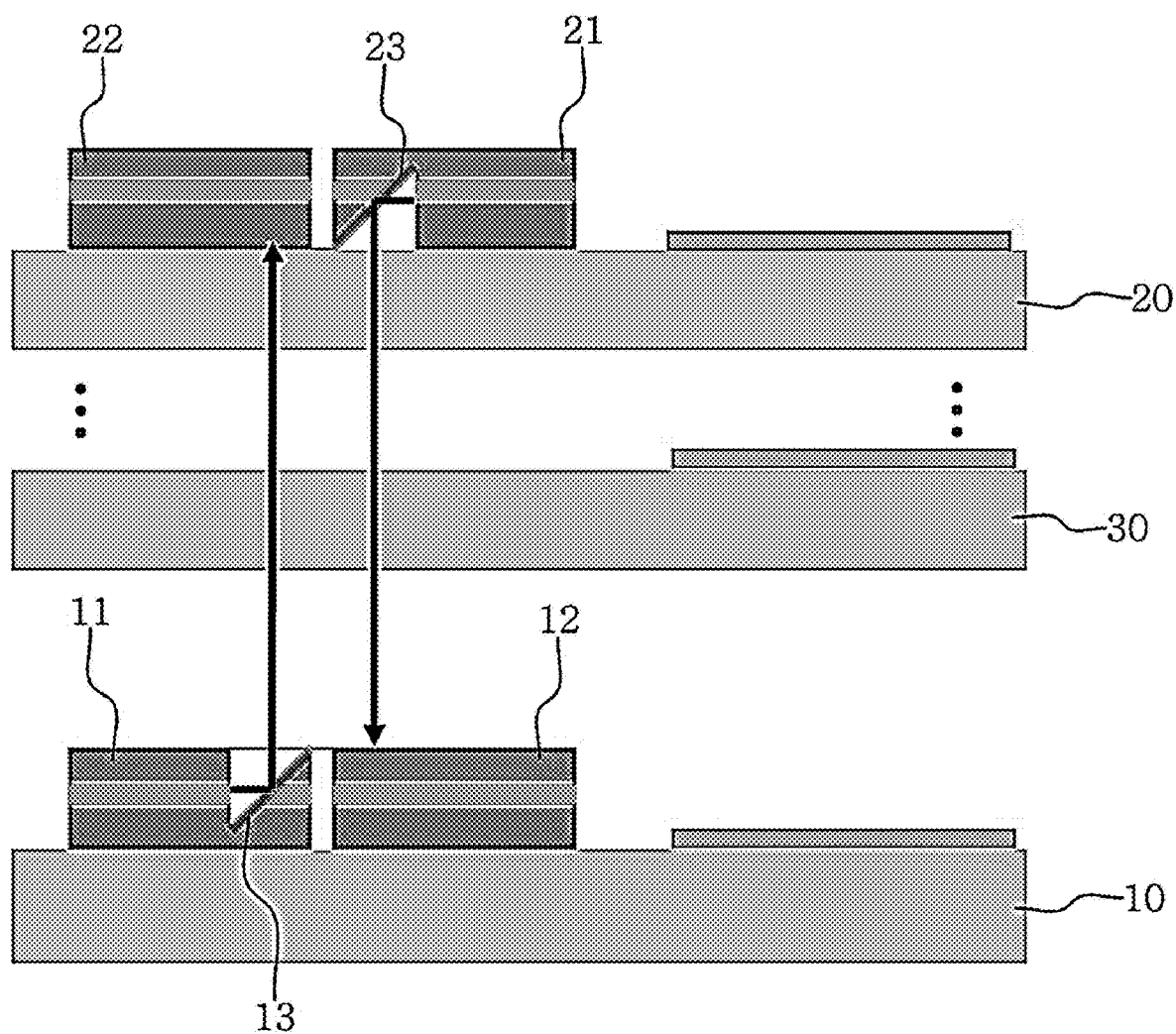
FIG. 5 is a diagram showing interconnection between semiconductor chips using optical interconnection technology according to an embodiment.

For example, referring to FIG. 5, the first substrate 10 has both the optical transmitter 11 and the optical detector 12, and the second substrate 20 has both the optical transmitter 21 and the optical detector 22 to transmit and receive an optical signal in both directions.

The third substrate 30 represents that optical interconnection may be implemented using a mid-infrared optical signal even in case that there is a plurality of additional substrates between the first substrate 10 and the second substrate 20. Likewise, the third substrate 30, a fourth substrate, a fifth substrate (and/or subsequent substrates) may also have a separate optical transmitter and optical detector, and the optical interconnection direction between each substrate may be appropriately designed according to the purpose.

The optical transmitters 11, 21 convert an electrical signal to an optical signal using a converter, and include a laser or an LED device to transmit the converted optical signal toward the optical detectors 12, 22 of other substrate.

The optical detectors 12, 22 include an optical detection device to detect an optical signal of a specific wavelength range (i.e., wavelength range of the optical signal transmitted from the optical transmitter), and convert the optical signal to an electrical signal using the converter and transmit it to the integrated circuit.

In an embodiment, the optical transmitters 11, 21 may include a laser to emit an optical signal of a mid-infrared wavelength range between 1.7 μm and 6 μm, and the optical detectors 12, 22 may include a photo-sensor to receive an optical signal of a mid-infrared wavelength range between 1.7 μm and 6 μm. For example, the laser and the photo-sensor may include a material such as an antimony (Sb) based material such as gallium antimonide (GaSb), indium phosphide (InP), gallium arsenide (GaAs), indium arsenide (InAs), indium nitride (InN), HgCdTe, lead sulfide/lead selenide (PbS/PbSe), two-dimensional carbon material and two-dimensional boron nitride.

InP or GaAs based quantum well or quantum dot lasers used in the wavelength range (for example, 1.3 μm or 1.55 μm) for interconnection are difficult to generate an optical signal of 2 μm or above, and to use a wavelength range in which silicon is transparent, a laser having structure other than the quantum well or quantum dot lasers using InP and GaAs is necessary.

For example, GaSb based quantum cascade laser (QCL), interband cascade laser (ICL) and type-I Quantum Well laser may be used. Further, in addition to the antimony (Sb) based laser, InP based type-II Quantum Well laser and GaAs meta-morphic growth laser may be used, and is not limited to a particular process and structure if it can generate a mid-infrared wavelength range of optical signal passing through silicon (Si) or germanium (Ge).

In an embodiment, the optical transmitters 11, 21 may include a refractor to transmit an optical signal upwards or downwards. For example, the optical transmitters 11, 21 may include a gold mirror having a gradient (for example, 45°) to transmit an optical signal vertically upwards, or a gold mirror having a gradient (for example, 135°) to transmit an optical signal vertically downwards.

In another embodiment, the optical transmitters 11, 21 may include a vertical-cavity surface-emitting laser (VCSEL) to transmit an optical signal vertically upwards or vertically downwards without using a refractor.

In another embodiment, the first substrate may have a grating structure with textures to transmit an optical signal transmitted from the optical transmitter vertically upwards or vertically downwards.

Besides, all desirable structures and methods for transmitting an optical signal vertically upwards or downwards, for example, adding a process of bending an optical fiber in the vertical direction, may be used in an embodiment of the present disclosure.

It is possible to design according to an emission angle for transmitting mid-infrared in a desired direction in the process of fabricating a 3D multilayer semiconductor chip package. According to embodiments, it is possible to design to emit light such that an optical signal is spread widely. In this case, the influence of accuracy or error of the process reduces, but interference may occur between the optical detectors.

Figure 6A:
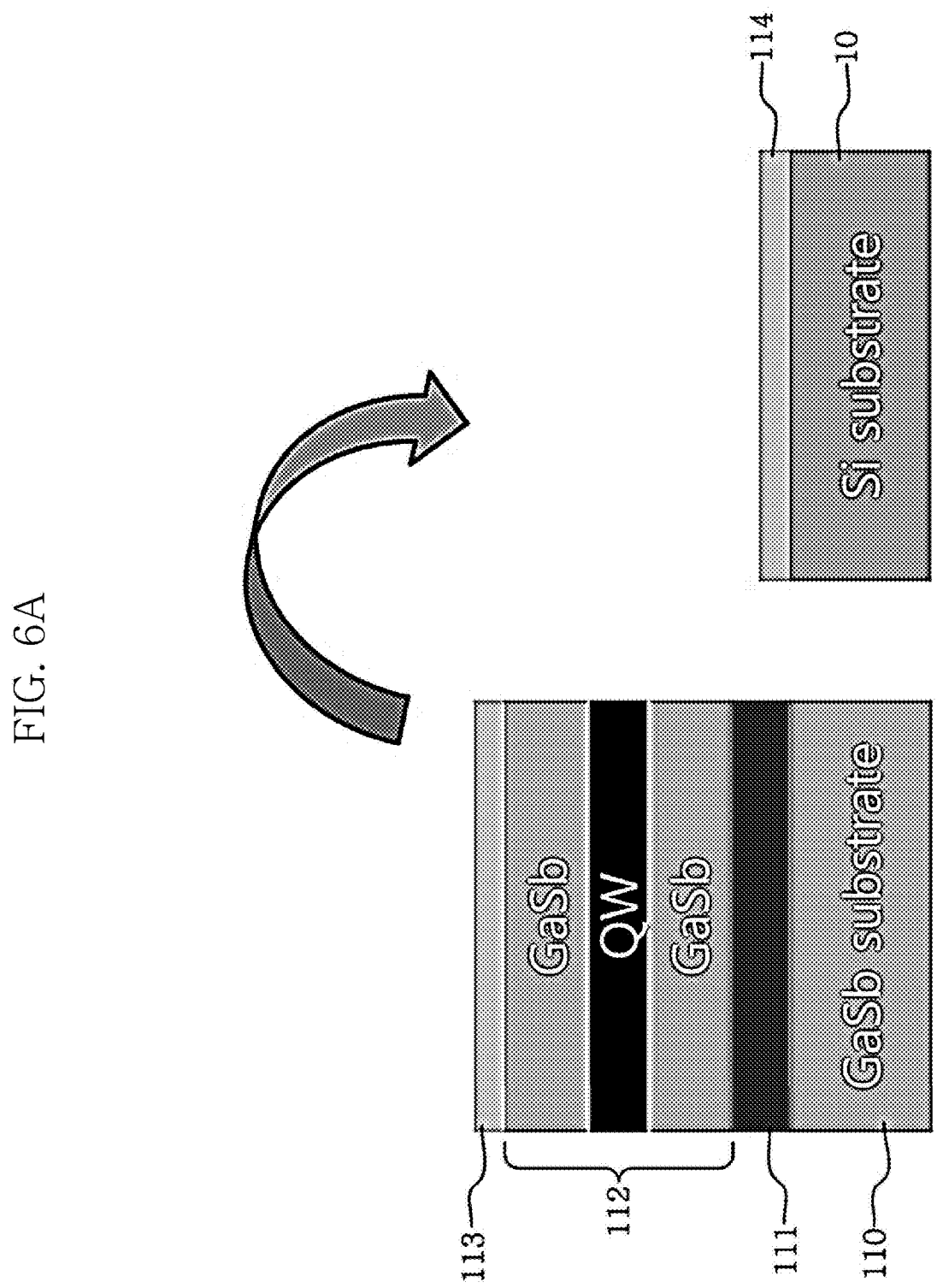
FIGS. 6A to 6C are diagrams showing a method for manufacturing an optical transmitter and an optical detector using an epitaxial lift-off process according to an embodiment.
Figure 6B:
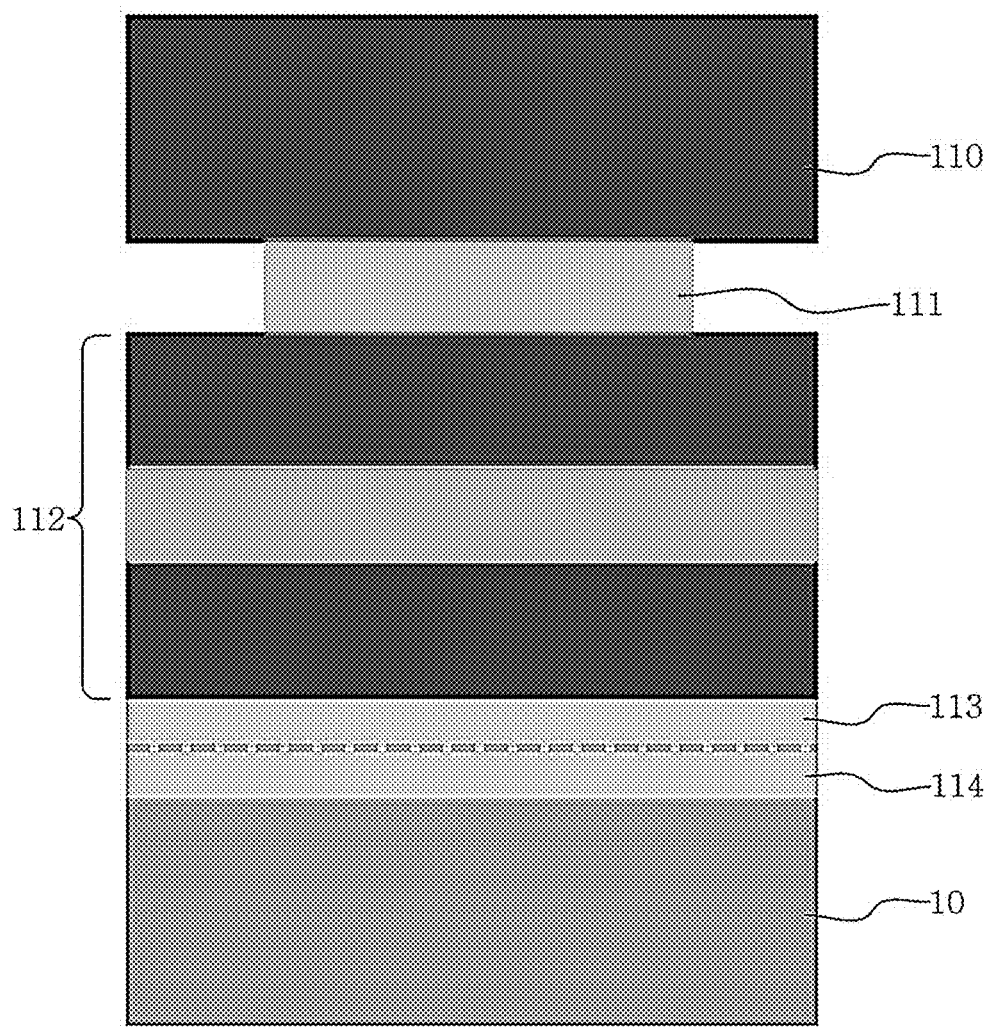
Figure 6C:
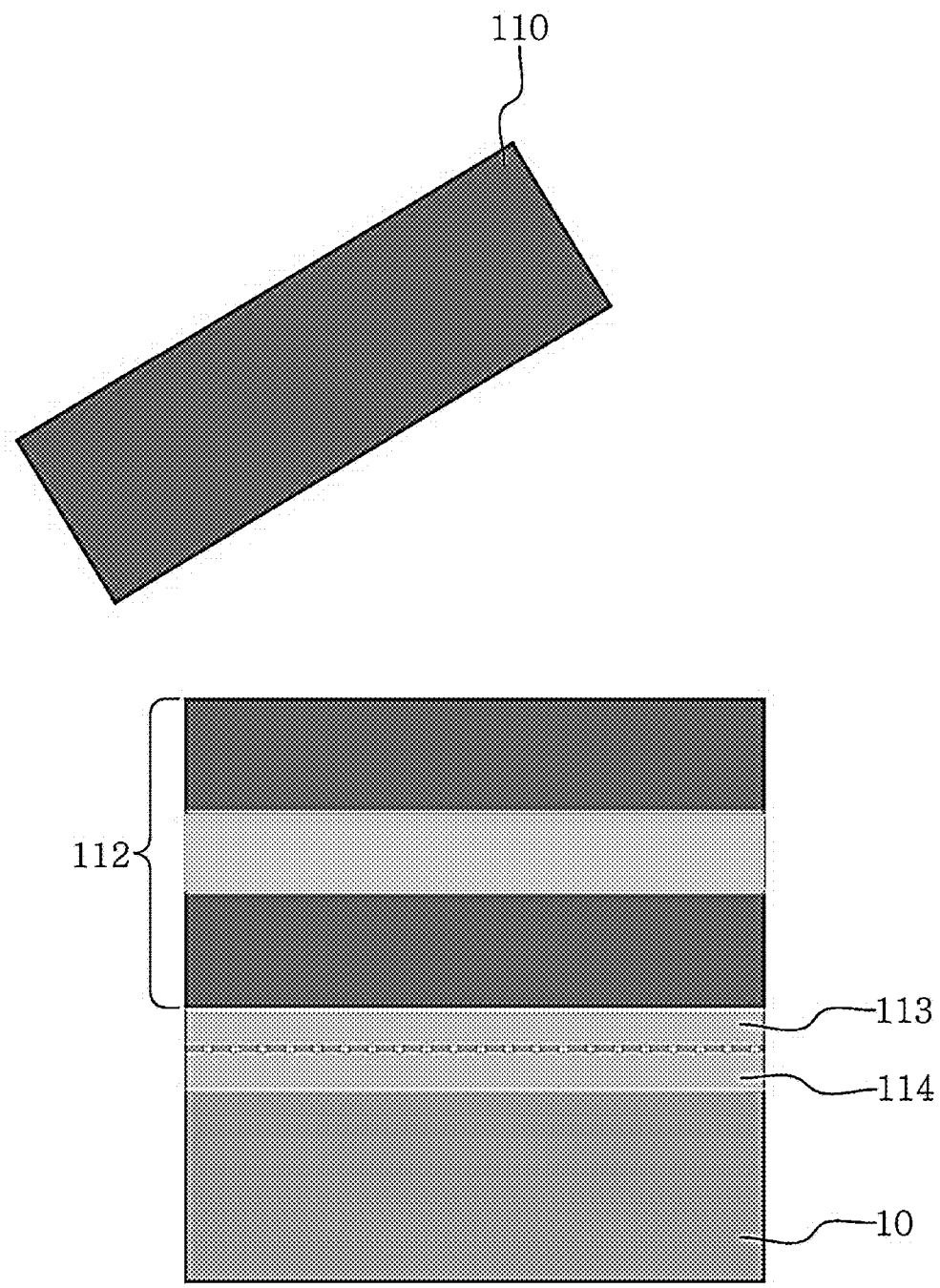

FIGS. 6A to 6C show a process of manufacturing an antimony (Sb) based laser using Epitaxial Lift-Off (ELO) technology for illustration purposes.

Referring to FIG. 6A, a sacrificial layer 111 is formed on a gallium antimonide (GaSb) substrate 110 through epitaxial growth, a laser structure 112 is formed on the sacrificial layer 111 through epitaxial growth, and an oxide thin-film layer 113 is formed on a laser structure 112.

The sacrificial layer 111 is removed by an etching solution later, and is used to separate the GaSb substrate 110 from a silicon substrate 10. In an embodiment, the sacrificial layer 111 may be made of III-V compound (for example, AlAs) including a high concentration of aluminum (Al) that is easily etched by a solution such as hydrogen fluoride (HF) or hydrogen chloride (HCl), but is not limited thereto.

Subsequently, an oxide thin-film layer 114 is formed on a silicon substrate 10, and the oxide thin-film layers 113, 114 are bonded together. The deposition method of the oxide thin-film layers on the structure and the silicon substrate may be performed, for example, by Chemical Vapor Deposition, and is not limited to a particular method.

In an embodiment, the oxide thin-film layers 113, 114 may be made of metal oxide, and bonded by the Metal Wafer Bonding process. For example, after two metal thin-film layers are placed adjacent to each other, the pressure may be applied to bond two substrates using metal bonding.

Referring to FIGS. 6B and 6C, the Epitaxial Lift-Off (ELO) process is performed to separate the GaSb substrate 110 from the laser structure 112 by selectively etching only the sacrificial layer 111. In this instance, the etching solution may be a hydrophilic solution including hydrogen fluoride (HF). For example, the etching solution may be a solution in which hydrogen fluoride (HF) and deionized water (DIW) are mixed at a predetermined ratio. Additionally, in an embodiment, the etching solution may further include isopropyl alcohol (IPA) and/or acetone. By the addition of these materials, gas bubbling occurring during the removal process of the sacrificial layer is suppressed by the hydrophilic solution, which makes the flow of the etching solution smooth.

According to the epitaxial lift-off process, only a necessary part for a device in an epitaxial layer of a semiconductor device may be transferred to a silicon (Si) substrate at a high speed, thereby manufacturing a large-scale template, and a semiconductor device may be repeatedly manufactured using the template, thereby greatly reducing the cost.

The integration process of the laser described above may be similarly applied to the direct process of the optical detector. In an embodiment, an optical detection structure (not shown), rather than the laser structure 112, may be formed on the sacrificial layer 111 by the epitaxial growth process, and an ELO process may be performed to integrate the optical detector onto the silicon substrate.

The optical transmitter and the optical detector may be manufactured by the same epitaxial lift-off process, thereby significantly reducing the cost required for the process. Further, when laser/detector functions are simultaneously performed using one transistor, the cost required for the process may be further reduced and the degree of integration may be improved.

According to the above-described optical interconnection between semiconductor chips, using a mid-infrared wavelength range of light that is transparent to semiconductor materials such as silicon and next-generation high-mobility materials, it is possible to enable interconnection between stacked semiconductor chips without using metal wiring. Using optical interconnection, it is possible to significantly reduce the bandwidth and power consumption, and overcome the limitations of TSV technology (for example, a limited number of stacks, high cost and low yield).

Additionally, as opposed to TSV technology, there is no need for substrate perforation and alignment processes, thereby reducing the process difficulty and cost, and it is possible to extend the photonics technology and platform established in the existing Si Photonics, thereby reducing the cost required for design.

While the present disclosure has been hereinabove described with reference to the embodiments shown in the drawings, this is for illustration purposes only and those skilled in the art will understand that various modifications and variations may be made thereto. However, it should be understood that such modifications fall within the technical protection scope of the present disclosure. Accordingly, the true technical protection scope of the present disclosure shall be defined by the technical spirit of the appended claims.

What is claimed is:

1. A method for optical interconnection between semiconductor chips, comprising:
converting an electrical signal to an optical signal;
transmitting the optical signal to a second substrate disposed above or below a first substrate using an optical transmitter provided on the first substrate;
receiving the optical signal using an optical detector provided on the second substrate; and
converting the received optical signal to an electrical signal,
wherein at least one of the first substrate and the second substrate includes a compound semiconductor comprising at least one material of silicon (Si), germanium (Ge), and silicon germanium (SiGe),
wherein the optical signal has a mid-infrared wavelength of a range between 1.7 μm and 6 μm passing through the compound semiconductor,
wherein the optical transmitter includes a laser and the optical detector includes a photo-sensor, the laser capable of transmitting and the photo-sensor capable of receiving the optical signal of a wavelength range between 1.7 μm and 6 μm,
wherein the first substrate has a grating structure with textures or the optical transmitter includes a mirror having a gradient, for transmitting an optical signal upwards or downwards.

2. The method for optical interconnection between semiconductor chips according to claim 1, wherein the optical signal is a mid-infrared wavelength range of light, and has transmittance more than a threshold for the first substrate and the second substrate.

3. The method for optical interconnection between semiconductor chips according to claim 1, wherein at least one substrate that is transparent to the optical signal is further stacked between the first substrate and the second substrate.

4. The method for optical interconnection between semiconductor chips according to claim 1, wherein each of the laser and the photo-sensor are made of III-V compound consisting of at least one material of gallium antimonide (GaSb), indium phosphide (InP), gallium arsenide (GaAs), indium arsenide (InAs) or a combination thereof.

5. The method for optical interconnection between semiconductor chips according to claim 1, wherein each of the laser and the photo-sensor are made of at least one material of indium nitride (InN), HgCdTe, lead sulfide/lead selenide (PbS/PbSe), two-dimensional carbon material and two-dimensional boron nitride.

6. The method for optical interconnection between semiconductor chips according to claim 1, wherein the optical transmitter includes a vertical-cavity surface-emitting laser (VCSEL) to transmit an optical signal upwards or in a vertical direction.

7. The method for optical interconnection between semiconductor chips according to claim 1, wherein the optical transmitter and the optical detector are integrated onto the first substrate and the second substrate respectively by an epitaxial lift-off process.

8. A semiconductor package for optical interconnection, comprising:
a first substrate and a second substrate stacked in the semiconductor package, at least one of the first substrate and the second substrate including at least one material of silicon (Si), germanium (Ge), and silicon germanium (SiGe);
a first converter provided on the first substrate for converting an electrical signal to an optical signal;
an optical transmitter for transmitting the optical signal to the second substrate disposed above or below the first substrate;
an optical detector provided on the second substrate for receiving the optical signal; and
a second converter provided on the second substrate for converting the optical signal to the electrical signal,
wherein the optical signal has a wavelength range between 1.7 μm and 6 μm passing through at least one material of silicon (Si), germanium (Ge), and silicon germanium (SiGe), and
the optical signal passes through either the first substrate or the second substrate,
wherein the first substrate has a grating structure with textures or the optical transmitter includes a mirror having a gradient, for transmitting an optical signal upwards or downwards.

9. The method for optical interconnection between semiconductor chips according to claim 1, wherein the laser and the photo-sensor comprise antimony (Sb) based compound semiconductor.

* * * * *